(12) United States Patent
Tanaka et al.

(10) Patent No.: US 7,253,115 B2
(45) Date of Patent: Aug. 7, 2007

(54) DUAL DAMASCENE ETCH PROCESSES

(75) Inventors: Hiroya Tanaka, Tomisato (JP); Chee Khiang Ivan Sim, Singapore (SG); Alok Jain, Singapore (SG); Yoshio Ishikawa, Narita (JP)

(73) Assignee: Applied Materials, Inc., Santa Clara, CA (US)

( * ) Notice: Subject to any disclaimer, the term of this patent is extended or adjusted under 35 U.S.C. 154(b) by 270 days.

(21) Appl. No.: 10/360,236

(22) Filed: Feb. 6, 2003

(65) Prior Publication Data
US 2004/0157460 A1 Aug. 12, 2004

(51) Int. Cl.
*H01L 21/302* (2006.01)
(52) U.S. Cl. ............... 438/706; 438/723; 438/724; 438/725
(58) Field of Classification Search ......... 438/706, 438/710, 714, 723, 724, 725
See application file for complete search history.

(56) References Cited

U.S. PATENT DOCUMENTS

| 5,407,524 | A | * | 4/1995 | Patrick et al. | 216/59 |
|---|---|---|---|---|---|
| 6,042,999 | A | * | 3/2000 | Lin et al. | 430/316 |
| 6,080,529 | A | * | 6/2000 | Ye et al. | 430/318 |
| 6,194,128 | B1 | * | 2/2001 | Tao et al. | 430/313 |
| 6,207,554 | B1 | * | 3/2001 | Xu et al. | 438/624 |
| 6,319,821 | B1 | * | 11/2001 | Liu et al. | 438/636 |
| 6,372,631 | B1 | * | 4/2002 | Wang et al. | 438/624 |
| 6,630,407 | B2 | * | 10/2003 | Keil et al. | 438/717 |
| 6,774,031 | B2 | * | 8/2004 | Ali et al. | 438/638 |
| 2003/0216026 | A1 | * | 11/2003 | Mukherjee-Roy et al. | 438/622 |

* cited by examiner

*Primary Examiner*—Kin-Chan Chen
(74) *Attorney, Agent, or Firm*—Patterson & Sheridan LLP

(57) ABSTRACT

A dual damascene trench etching process includes a two-step BARC etching process, a first BARC etch step using a fluorocarbon-based plasma, and a second BARC etch step using an $O_2/N_2$-based plasma. The first BARC etch step removes a first portion of the BARC covering a dielectric stack using a fluorocarbon-based plasma. The second BARC etch step removes a second portion of the BARC covering the dielectric stack using a $O_2/N_2$ based plasma. The dual damascene trench etching process may further include a BARC etch back process to remove a further portion of the BARC not covering the dielectric stack. The dual damascene trench etching process further includes a low-k dielectric etching process that etches trenches in a low-k dielectric layer in the dielectric stack and that avoids the use of argon in order to prevent facet formation.

16 Claims, 8 Drawing Sheets

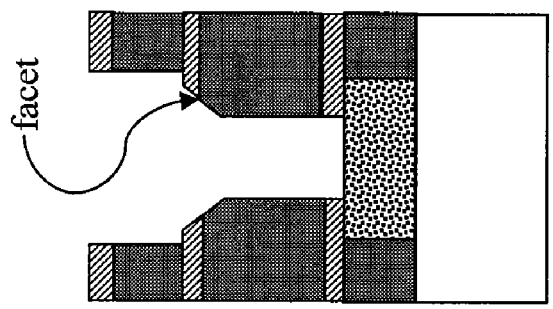
FIG. 2C *PRIOR ART*
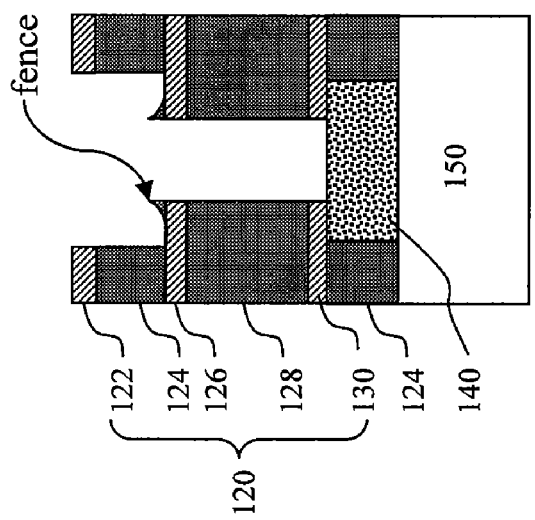
FIG. 2B *PRIOR ART*
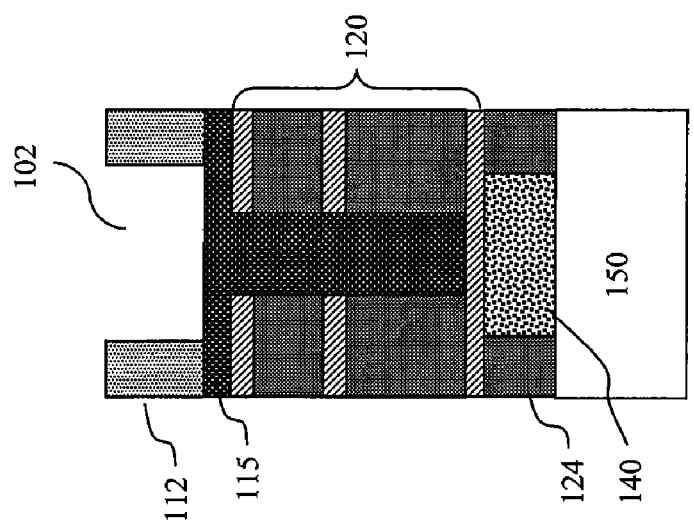
FIG. 2A *PRIOR ART*

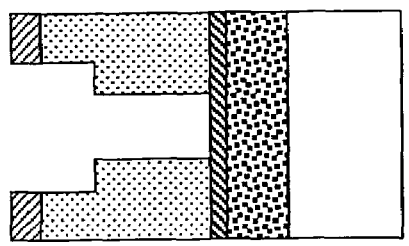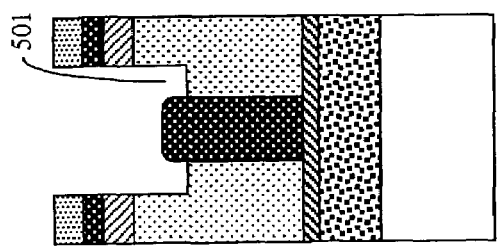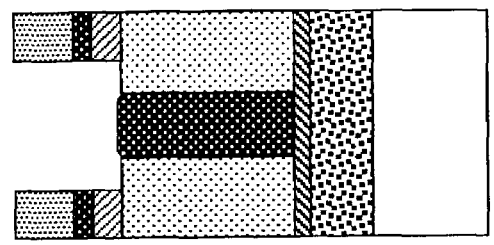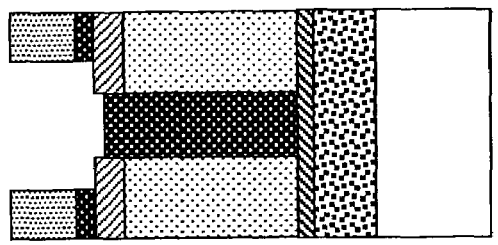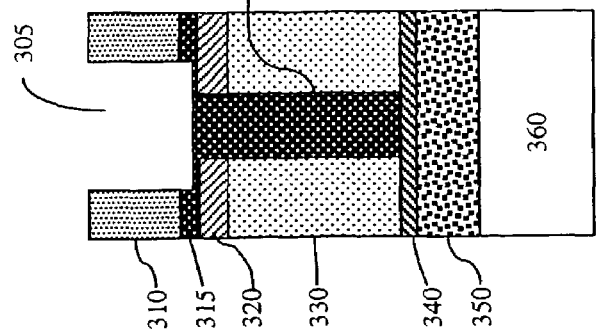

DUAL DAMASCENE ETCH PROCESSES

The present application relates to semiconductor processing technologies, and particularly to etching patterns in a layer of dielectric material having low dielectric constant.

BACKGROUND

The performance, density, and cost of integrated circuit (IC) chips have been improving at a dramatic rate. Much of the improvement has been due to the ability to scale transistors to increasingly smaller dimensions, resulting in higher speed and higher functional density. The continued shrinking of transistor sizes on the IC chips, however, poses many challenges to back-end interconnects. As the minimum feature size on the IC's shrinks below 0.18 µm, the metal interconnect lines become thinner and more densely packed, resulting in greater resistance in the metal lines and larger inter-metal capacitance, and therefore a longer time delay or slower operating speed. By changing to different materials, i.e., higher conductivity material for the metal lines and lower permittivity (low-k) dielectric for the insulating material, device geometry can continue to shrink without adversely impacting the maximum operating speed. This prompted the switch from aluminum and silicon dioxide to copper and low-k dielectrics in the backend process flow for manufacturing many current and future IC devices.

The switch from aluminum/oxide to copper/low-k involves a variety of fundamental changes in the backend manufacturing process flow. Since it is difficult to etch copper, new approaches such as "damascene" or "dual damascene" processing are required. Copper damascene/dual-damascene is a process where VIAs and/or trenches are etched into the insulating material. Copper is then filled into the VIAs and/or trenches and sanded back using a process such as chemical mechanical polishing (CMP), so the conducting materials are only left in the VIAs and trenches. In the dual damascene approach, both VIAs and trenches are patterned into a layer of dielectric material or a stack of different dielectric materials before copper fill. An advantage of this approach is that only one copper fill and CMP is necessary to form a layer of metal lines and VIAs that connect the layer of metal lines to another layer of metal lines. The dual damascene approach, however, may require a rather complex dielectric stack that includes a sequence of hard mask, low-k dielectrics, and etch stop layers.

Different processing sequences of etching VIAs and trenches in dielectric material(s) can be used in a dual damascene process. FIGS. 1A-1E illustrates a "VIA-first" processing sequence for etching VIAs and trenches in a dielectric stack 120. As shown in FIG. 1A, dielectric stack 120 comprises from top to bottom an optional hard mask layer 122, a first dielectric layer 124, an optional middle stop layer 126, a second dielectric layer 128, and a bottom stop layer 130. The first and second dielectric layers are typically made of a low-k dielectric material. The hard mask layer, the middle stop layer and the bottom stop layer are typically made of silicon oxy-nitride (SiON), tetra-ethyl-ortho-silicate (TEOS) based oxide, silicon carbide, or the like. Dielectric stack 120 is formed on a substrate 150. A first layer of metal lines 140 also formed on substrate 150 lie under the dielectric stack 120.

In the VIA-first sequence shown in FIGS. 1A-1E, a VIA lithography process is performed first (FIG. 1A), which forms a first photoresist mask 110 on top of the dielectric stack 120 to define VIA openings, such as opening 101, for etching VIAs. Then VIAs are etched through dielectric stack 120, stopping at the bottom stop layer 130. After the VIA mask 110 is stripped (FIG. 1B), a trench lithography process is performed (FIG. 1C), which forms a second photoresist mask 112 on top of the dielectric stack 120 to define trench openings, such as opening 102, for etching trenches. As shown in FIG. 1D, the trenches are etched through the hard mask layer 122 and the first dielectric layer 124, stopping at the middle stop layer 126, if such layer is provided. An opening is also etched in bottom stop layer 130. After the trench mask 112 is stripped (FIG. 1D), both the trench and the VIA are filled with copper and the copper fill is planarized with a CMP step (FIG. 1E), resulting in the formation of a second layer of metal lines 142 and connections 144 between the first and second layers of metal lines.

Besides the complex dielectric stack, the dual damascene approach also raises issues with the trench lithography process. After etching the VIAs in the dielectric stack 120, the use of a single layer of photoresist mask 112 on the resulting topography typically results in severe critical dimension (CD) variations. The CD variations are due partly to local reflectivity changes over the substrate, and partly to photoresist thickness variations, both resulting from changes in VIA density across the substrate. One solution to this problem is to use an organic bottom anti-reflective coating (BARC). As shown in FIG. 2A, a BARC layer 115 can be spin-applied to fill the VIAs and cover the dielectric stack before trench lithography. The BARC helps to make the reflectivity more uniform, and to decrease variations in surface topography resulting from the presence of VIAs. A BARC etching process is usually performed to clear away the BARC 315 in trench openings (i.e., portions of the BARC 315 not covered by the trench mask 112) before etching the trenches.

The spin-applied BARC, however, typically does not fill a dense array of VIAs and isolated VIAs in the same way. Usually, isolated VIAs are filled more easily than dense VIAs, resulting in large variation of BARC thickness on top of the dielectric stack between dense and isolated VIA structures. The non-uniform BARC thickness raises several issues. Firstly, because etch rates of typical organic BARCs are similar to that of the photoresist, a thick photoresist mask is usually required so that, after the BARC at all trench openings is etched away, enough photoresist mask is left for the subsequent trench etching process. The requirement of the thick photoresist mask is disadvantageous for CD control, especially when small dimensions are involved. Secondly, while the BARC at the trench openings is being cleared, portions of hard mask layer 122 in dielectric stack 120 are exposed to the BARC etching process at different times, resulting in the part of the hard mask over dense VIAs being etched more than the part of the hard mask over isolated VIAs. The non-uniform thickness of the hard mask leads to non-uniform trench depth during the subsequent trench etching process, so that the middle stop layer 126 becomes necessary for trench depth uniformity control.

The BARC fill and the trenching etching process may also lead to other problems, such as fencing and facet formation in the trenches, as shown in FIGS. 2B and 2C, which may cause degradation of the IC devices being fabricated.

SUMMARY

The present invention addresses the aforementioned problems by providing an etching process for creating dual damascene structures. The dual damascene etching process of the present invention allows the use of a thin photoresist trench mask and a simplified dielectric stack, and avoids problems such as fencing and facet formation encountered by conventional dual damascene etching processes. In one embodiment of the present invention, a VIA-first approach is used, and after VIA etching, a BARC material is spin-applied to fill the VIAs and cover a hard mask layer before trench lithography. The dual damascene etching process includes a two-step BARC etching process, a first BARC etch step using a fluorocarbon-based plasma, and a second BARC etch step using an $O_2/N_2$ plasma. The first BARC etch step removes the BARC in trench openings until portions of the hard mask layer become exposed to the fluorocarbon-based plasma. The second BARC etch step clears up the BARC in all of the trench openings without damaging the hard mask layer. The dual damascene etching process may further include a hard mask etching step that opens the hard mask at the trench openings and a BARC etch back process after the hard mask etching process. The BARC etch back process removes a further portion of the BARC in the trench openings and helps to avoid the problem of fencing.

In one embodiment of the present invention, the dual damascene etching process further includes a low-k dielectric etching process that avoids the use of argon in order to prevent facet formation. The trench etching process etches trenches in a low-k dielectric layer under the hard mask and uses a process gas comprising one or more fluorocarbon gases, a nitrogen-containing gas, and a small amount of oxygen. With the second BARC etch step, the trench etching process may be performed more uniformly so that the middle stop layer required by some conventional dual damascene processes is no longer needed.

DRAWINGS

Additional objects and features of the invention will be more readily apparent from the following detailed description and appended claims when taken in conjunction with the drawings, in which:

FIG. 2A is a schematic view in vertical cross-section of a dielectric stack after BARC fill and before trench etching;

FIG. 2B is schematic cross-sectional view of a dual damascene trench illustrating the problem of fencing in the dual damascene trench;

FIG. 2C is schematic cross-sectional view of a dual damascene trench illustrating the problem of facet formation in the dual damascene trench;

FIGS. 5A to 5E are schematic cross-sectional views of a low-k dielectric layer at different stages during a dual damascene trench etching process according to one embodiment of the present invention;

In FIGS. 3, 5A-5E, 6A-6C and 7A-7C, similar structural features are designated by identical numbers.

DESCRIPTION

Figure 3:
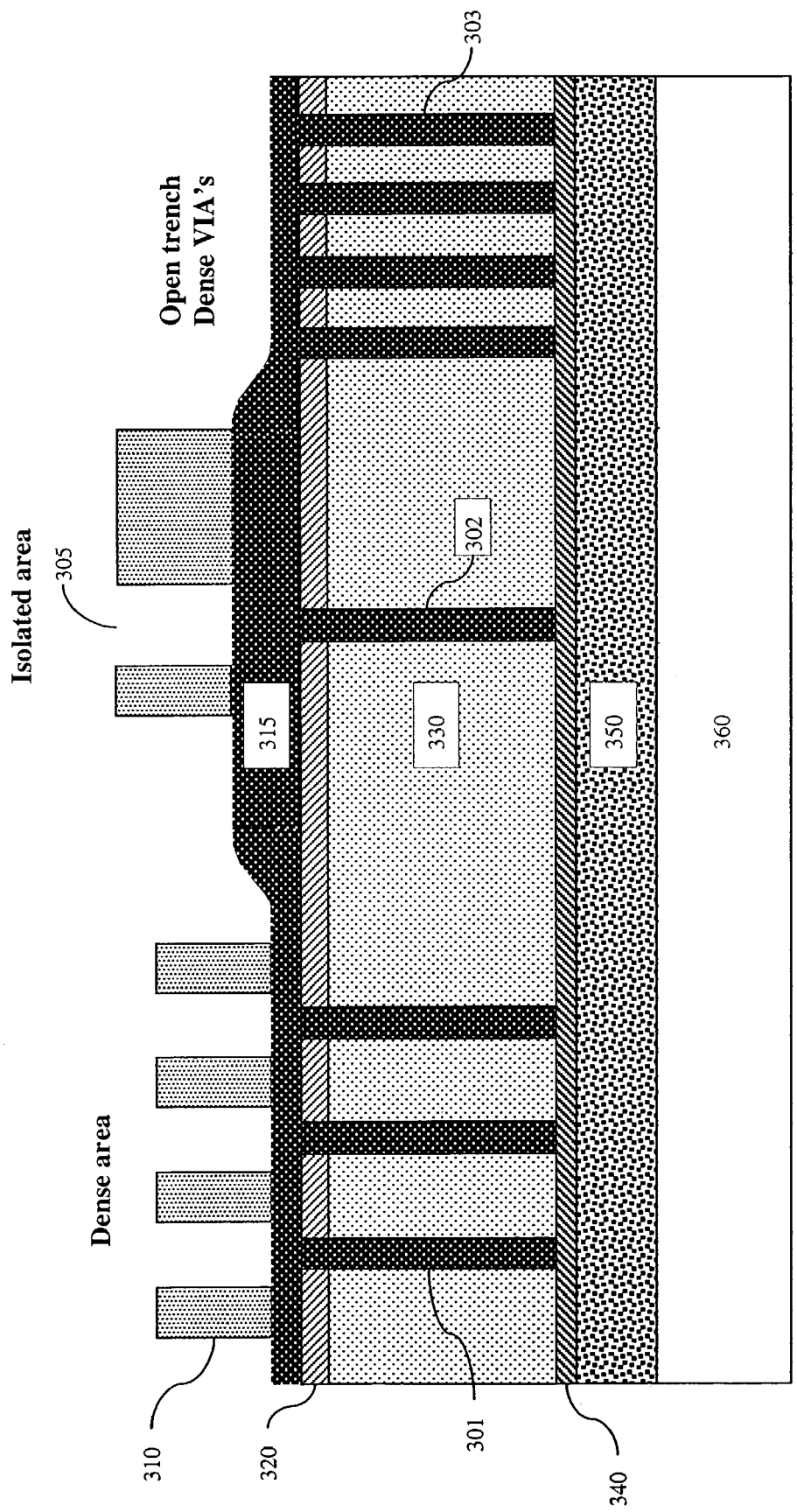
FIG. 3 is a schematic view in vertical cross-section of a group of VIAs in a dielectric stack after VIA etching and BARC fill according to one embodiment of the present invention.

The present invention includes an etching process for etching dual damascene trenches after VIAs are formed in a dielectric stack. FIG. 3 illustrates in vertical cross-section a group of VIAs, such as VIAs 301, 302, and 303, in a dielectric stack, according to one embodiment of the present invention. The dielectric stack includes a hard mask layer 320 over a low-k dielectric layer 330 formed on a substrate 360. Metal lines 350 lie under portions of the low-k dielectric layer 330 and are separated from the low-k dielectric layer 330 by a barrier/liner layer 340. A BARC material 315 is spin-applied to fill the VIAs 301, 302, and 303 and cover the hard mask layer 320. A trench mask 310 is formed over the BARC 315 to define trench openings, such as trench opening 305 on top of VIA 302. As is shown, because isolated VIAs, such as VIA 302, are filled more easily by the BARC 315 than VIAs in dense VIA areas, such as VIAs 301 and 303, the BARC 315 on top of the hard mask layer 120 over dense VIAs is thinner than that over isolated VIAs.

Figure 4:
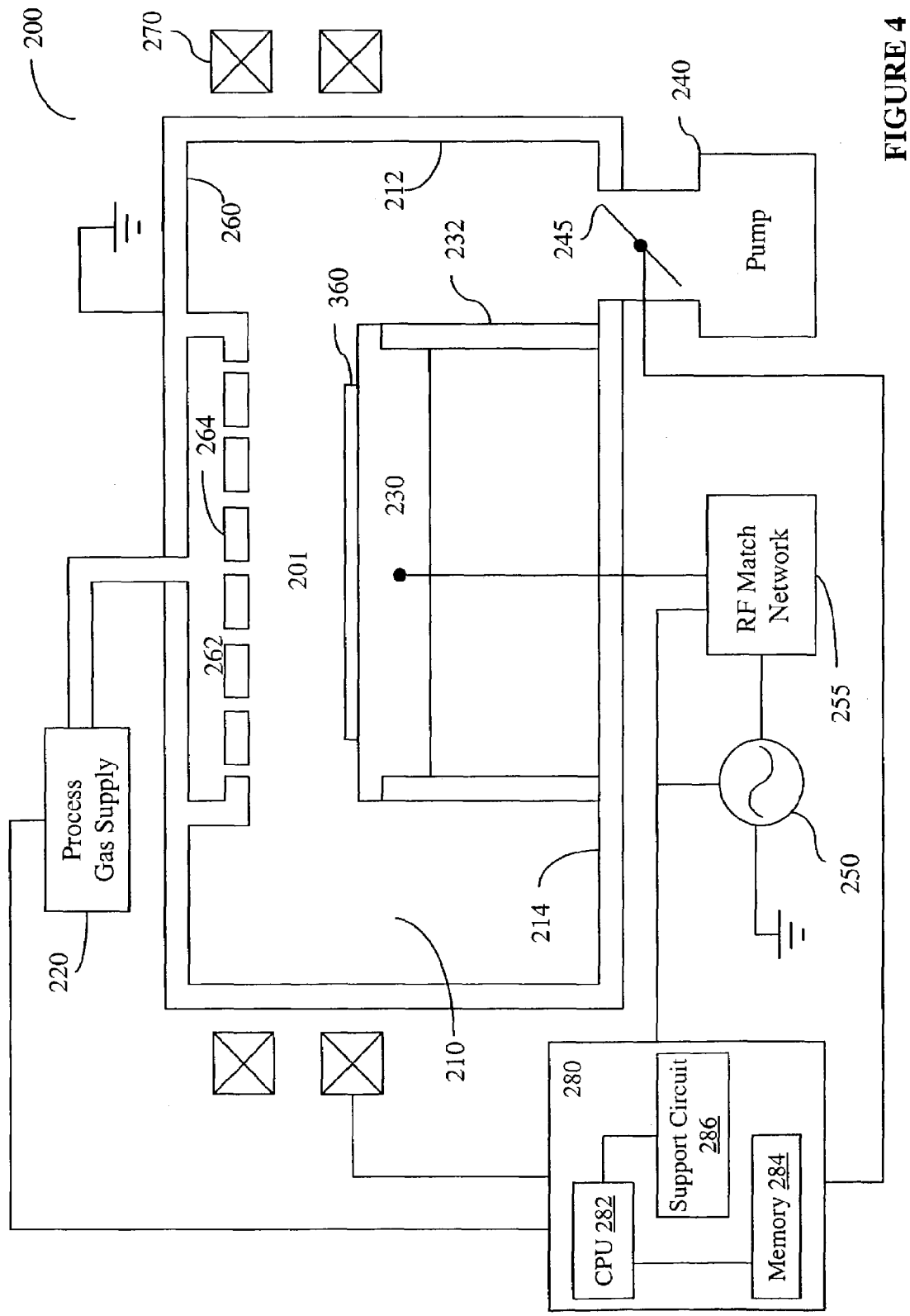
FIG. 4 is a schematic cross-sectional view of a plasma reactor that can be used to practice a dual damascene etching process according to one embodiment of the present invention.

The etching process of the present invention can be performed in a plasma reactor, such as, for example, the Dielectric Etch eMAX system, the Dielectric Etch Super e Centura system, or the Dielectric Etch IPS Centura system, all of which are commercially available from Applied Materials Inc., Santa Clara, Calif. FIG. 4 illustrates a magnetically enhanced reactive ion etching (MERIE) reactor 200, as one example of a reactor that can be used to carry out the etching process in one embodiment of the present invention. The reactor 200 comprises a chamber 210 enclosed by a wall 212, a base 214, and a ceiling 260. The chamber includes a process zone 201 comprising a volume of about 5,000 to about 50,000 $cm^3$. The reactor 200 further comprises a process gas supply 220 that supplies gases into the chamber 210 through a gas manifold 262 and a gas distribution plate (GDP) 264 at the ceiling 260 of the chamber 210. Spent process gas and volatile etch products are pumped out from the process chamber 210 by a pump 240. A throttle valve 245 controls the pressure in the chamber 210. The wall 212, the base 214, the ceiling 260, and the GDP 264 are usually made of aluminum with anodized aluminum coating on at least the surfaces facing the inside of the chamber 210. The wall 212, the base 214, the ceiling 260, and the GDP 264 are typically grounded. The chamber 210 further includes a pedestal 230 that supports a substrate, such as substrate 360, in the chamber 210. The pedestal 230 is electrically isolated from the base 214 by an insulator support ring 232 and is connected to a radio frequency (RF) power source 250 through an impedance match network 255.

A controller 280 comprising a CPU 282, a memory 284, and support circuits 286 for the CPU 282 is coupled to the various components of the reactor 200 to facilitate control of the various components of the reactor 200. The memory 284 can be any computer-readable medium, such as random access memory (RAM), read only memory (ROM), floppy disk, hard disk, or any other form of digital storage, local or remote to the reactor 200 or CPU 282. A software routine or a series of program instructions stored in the memory 284, when executed by the CPU 282, causes the reactor 200 to perform processes of the present invention.

When reactor 200 is used to etch a layer of material on substrate 360, chamber 210 is evacuated by pump 240 to a pressure of less than about 1 mTorr. The substrate is transferred into chamber 210 from a load lock transfer chamber (not shown) maintained at near vacuum, and is placed on the pedestal 230. The substrate can be held in place during the dielectric etching process using a mechanical or electrostatic chuck (not shown) with grooves in which a coolant gas, such as helium, is circulated to control the temperature of the substrate.

Gaseous components are then introduced into the chamber 210 at various volumetric flow rates to form a process gas. Once the pressure in the chamber 210 is stabilized at a desired level, the RF power source 250 is turned on to strike a plasma in the process zone 201. Impedance match network 255 may also be tuned for efficient coupling between the RF power source 250 and the plasma in processing chamber 210. With the RF source 250 turned on, the pedestal 230 acts as a cathode electrode, while the grounded wall 212, ceiling 260 and the GDP 264 together serve as an anode electrode. The reactor configuration of FIG. 4 facilitates reactive ion etching (RIE) processes, where RF voltage at a power level of about 100 to about 3000 Watts is applied to the cathode electrode below the substrate 360 while the anode electrode (s) are grounded. The plasma is thus generated and maintained by capacitively coupled RF power between the cathode and the anode electrodes. A substantial DC bias typically exists between the plasma and the cathode electrode, resulting in energetic ion bombardment on the substrate. The plasma of the process gas is turned off after a predetermined time period or by using an optical endpoint measurement technique.

The plasma density, defined as the number of ions per unit volume, may be enhanced by placing plural magnets 270 around the chamber wall 212 to provide a slowly rotating magnetic field in the chamber 210. The magnets may be electromagnets driven with respective phases of a low frequency (e.g., 0.1-0.5 Hertz) AC current source (not shown). Alternatively, the magnets may be permanent magnets mounted on a slowly rotating support structure (not shown) rotating at, for example, 0.1-0.5 revolutions per second.

FIG. 4 only shows one configuration of the many plasma reactors that can be used to practice the present invention. For example, the reactor 200 may include other power sources in addition to or in place of the RF power source 250, and power can be coupled into the chamber 210 to strike and maintain a plasma therein through differently configured coupling hardware such as known in the art, without affecting the application of the present invention. For example, in addition to the power from the RF power source 250, a very high frequency (VHF) power can be applied to the anode electrode, or an RF voltage can be applied to an inductor coil to inductively couple energy into the chamber 210, so that the plasma density in the process zone 201 and the DC bias of the pedestal can be controlled separately by two different power sources.

FIGS. 5A-5E and FIG. 8 illustrate an etching process (process) 800 for etching dual damascene trenches after VIAs are formed in the dielectric stack on substrate 360 as shown in FIG. 3, according to one embodiment of the present invention. Process 800 includes a BARC main etch step 810. The process gas used in the BARC main etch step 810 includes one or more fluorocarbon gases, such as $CF_4$, $C_2F_6$, $C_2F_8$, $C_3F_8$, $C_4F_{10}$, $C_4F_8$, $CHF_3$, etc., of which $CF_4$ or a $CF_4/CHF_3$ combination is more often used. The process gas in the BARC main etch step 810 may further include an inert gas, such as helium, argon, neon, xenon, and krypton, of which argon is most often used. The BARC main etch step 810 etches away all or most of the BARC 315 on top of the hard mask layer 320 in trench openings on top of dense VIAs, such as VIAs 301 and 303, as shown in FIG. 3. The BARC main etch step 810 is terminated either after a predetermined time period or by a conventional optical endpoint measurement technique that determines, by monitoring emissions from the plasma, whether portions of the hard mask layer 320 in some trenches have become exposed to the plasma. After the BARC main etch step 310, the hard mask layer 320 in trench openings on top of isolated VIAs, such as VIA 302 under trench opening 305 in FIG. 3, may still be covered by the BARC 315, as shown in FIG. 5A.

Process 800 further includes a BARC over etch step 820. As shown in FIG. 5B, the BARC over etch step 820 clears away the BARC 315 on top of the hard mask layer 320 in all trench openings. In one embodiment of the present invention, the process gas used in the BARC over etch step 820 includes an $O_2/N_2$ gas mixture. The plasma of the $O_2/N_2$ gas mixture etches the BARC 315 without causing any damage to the hard mask layer 320, which has become exposed to the plasma during BARC etching. The BARC over etch step 820 is terminated after a predetermined period of time.

Process 800 further includes a hard mask etch step 830. As shown in FIG. 5C, the hard mask etch step 830 transfers patterns of a trench mask 310 to the hard mask layer 320 and opens up the hard mask for subsequent trench etching through the low-k dielectric layer 330. The process gas used in the hard mask etch step 830 includes one or more fluorocarbon gases, such as $CF_4$, $C_2F_6$, $C_2F_8$, $C_3F_8$, $C_4F_{10}$, $C_4F_8$, $CHF_3$, etc., of which $C_2F_4$ or a $CF_4/CHF_3$ combination is more often preferred. The hard mask etch step 830 is terminated either after a predetermined time period or by a conventional optical endpoint measurement technique that determines, by monitoring emissions from the plasma, whether portions of the low-k dielectric layer 330 in some trenches have become exposed to the plasma.

Process 800 further includes a low-k dielectric etch step 850. As shown in FIG. 5D, the low-k dielectric etch step 850 etches trenches, such as trench 501, in the low-k dielectric layer 330. The process gas used in the low-k dielectric etch step 820 includes one or more fluorocarbon gases with relatively high fluorine to carbon ratios, such as $CF_4$, $C_2F_8$, $CHF_3$, etc., of which $CF_4$ or a $CF_4/CHF_3$ combination is more often preferred. The process gas used in the low-k dielectric etch step 820 further includes a nitrogen-containing gas, such as $N_2$, $NH_3$, $NF_3$, of which $N_2$ is more often preferred. Unlike many conventional low-k dielectric etching processes, in this example the process gas used in the low-k dielectric etch step 820 does not include an inert gas such as argon. Etching the low-k dielectric layer 330 without including argon in the process gas helps minimize the problem of VIA faceting shown in FIG. 2C.

Figure 1E:
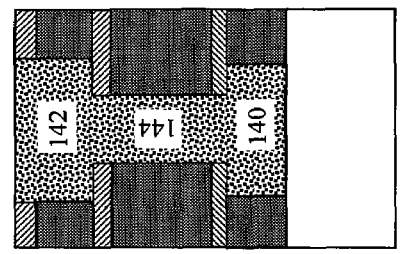
FIGS. 1A to 1E are schematic views in vertical cross-section of a dielectric stack at different stages in a conventional VIA-first dual damascene etching sequence.
Figure 1D:
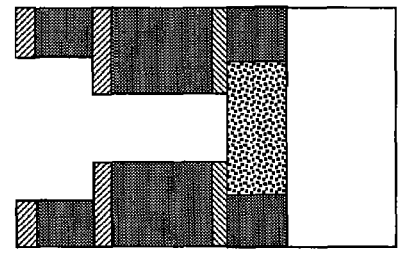
Figure 1C:
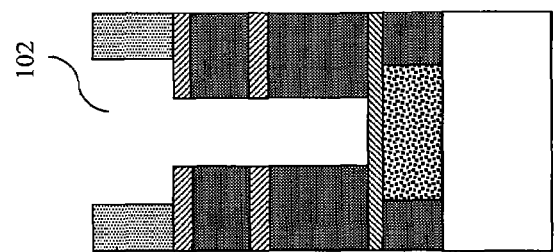
Figure 1B:
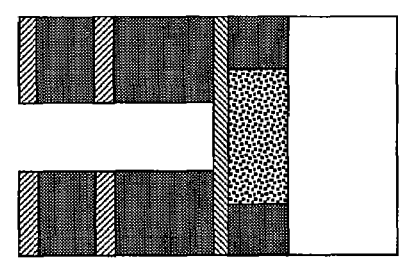
Figure 1A:
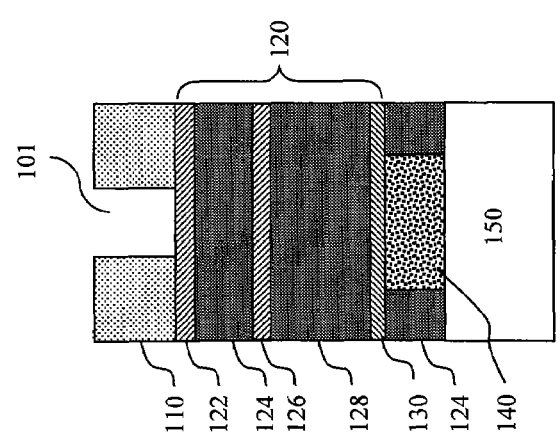

The hard mask layer 320 is not damaged during the BARC main etch step 810, which is terminated after portions of the hard mask layer 320 became exposed to the plasma, or during the BARC over etch step 820, which uses an $O_2/N_2$ based plasma that does not attack the hard mask layer 320. As a result, the uniformity of etch depths across the substrate 360 during the hard mask etch step 830 and the low-k dielectric etch step 850 is not influenced by the non-uniform BARC 315 over the hard mask layer 320. So, the middle stop layer, such as layer 126 in FIG. 1A, required by many conventional dual damascene etching processes, is not required by the etching processes of the present invention. Without the middle stop layer, the low-k dielectric layer is terminated after a time period determined by measured etch rate data and a desired trench depth for a specific application.

After the low-k dielectric etch step, a barrier/liner etching process may be performed to etch away portions of the barrier/liner layer 340 in the VIAs. Then the trench mask 310 and the BARC are stripped, leaving the trenches and VIAs as shown in FIG. 5E, for subsequent copper fill and CMP.

Figure 6C:
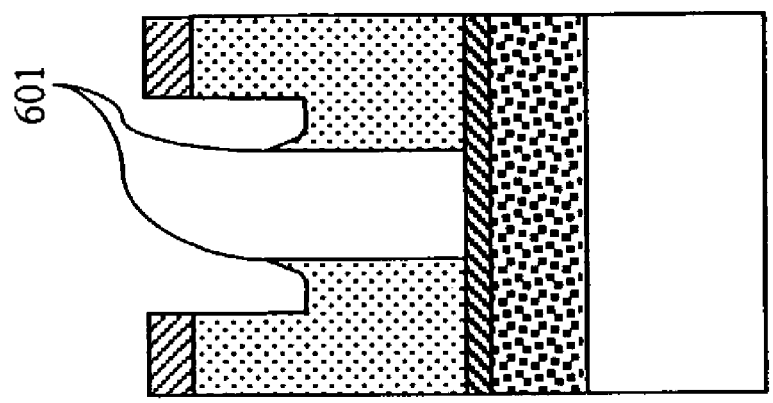
FIGS. 6A to 6C are schematic cross-sectional views of a low-k dielectric layer at different stages during a dual damascene trench etching process, illustrating the problem of fencing.
Figure 6B:
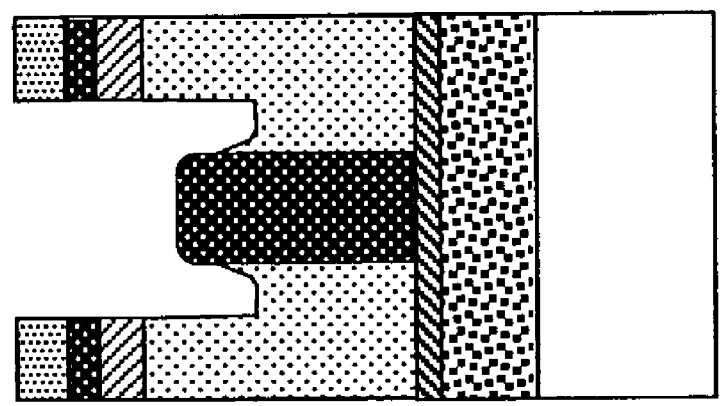
Figure 6A:
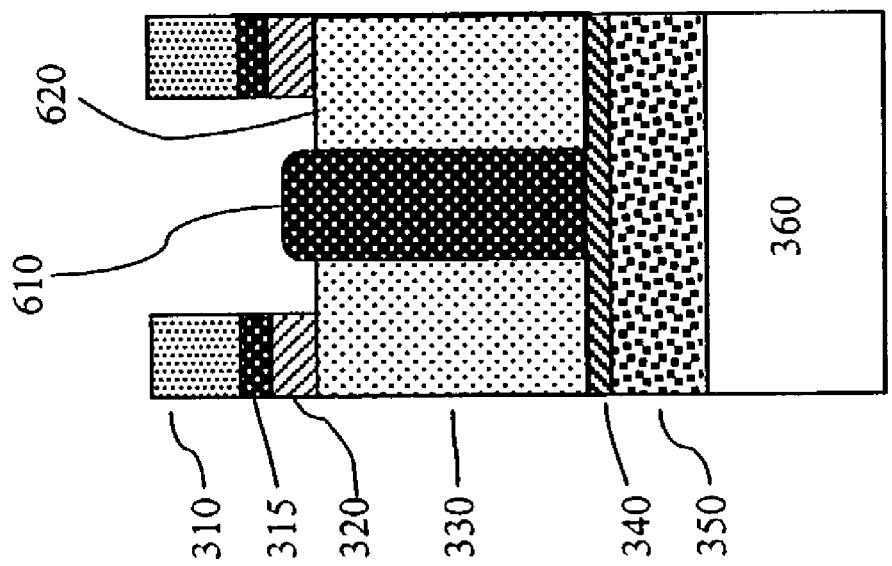

In one embodiment of the present invention, process 800 further includes a BARC etch back step 840 after the hard mask etch step 830 and before the low-k dielectric etch step 850. The BARC etch back step 840 is performed to minimize the problem of fencing shown in FIG. 2B. VIA fences can be formed when the hard mask etch step 330 uses a process gas that is highly selective to the photoresist mask 310. For example, in one embodiment of the present invention, a $C_2F_6$/Ar mixture is used as the process gas in the hard mask etch step 830 to enhance the etching selectivity to the mask layer 310. Higher selectivity to the trench mask 310 results in reduced resist loss and allows the use of a thinner trench mask. However, since the BARC 315 typically has similar etching characteristics as that of the photoresist, a high selectivity to photoresist mask 310 also means a high selectivity to the BARC 315, so that when the hard mask is opened, the top 610 of the BARC 315 may protrude out of the top 620 of the low-k dielectric layer 330 in trench openings, as shown in FIG. 6A. The protruded portion of the BARC may create a shadowing effect, as shown in FIG. 6B, causing portions of the low-k dielectric layer 330 adjacent the BARC to be etched slower. So, as shown in FIG. 6C, when the trench mask 310 and the BARC 315 are stripped away, fences 601 appear in the trenches.

Figure 7C:
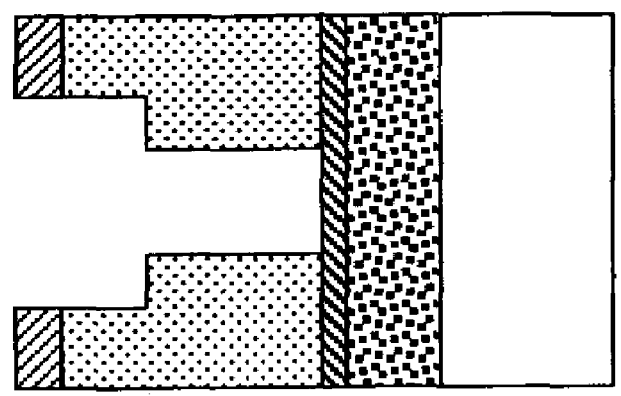
FIGS. 7A to 7C are schematic cross-sectional views of a low-k dielectric layer at different stages during a dual damascene trench etching process according to an alternative embodiment of the present invention.
Figure 7B:
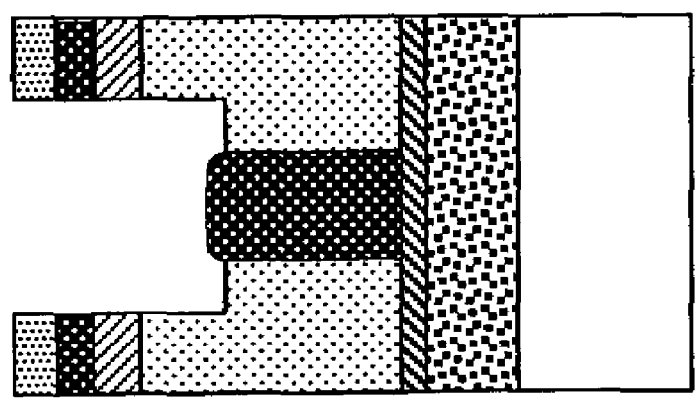
Figure 7A:
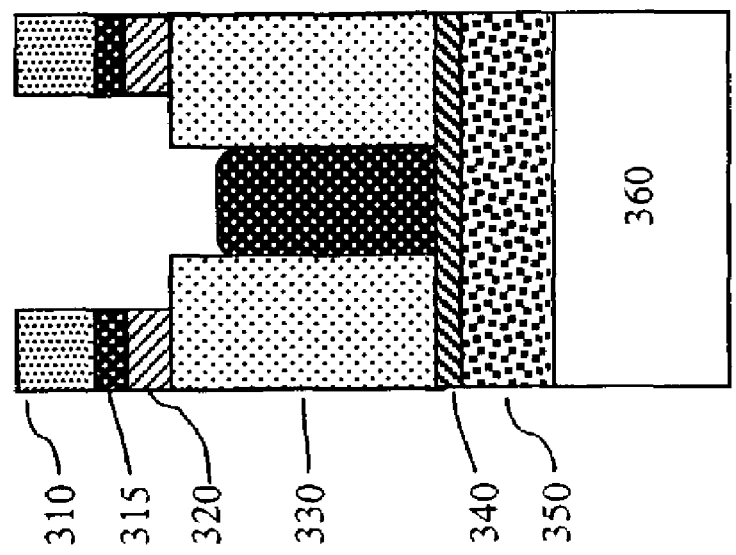
Figure 8:
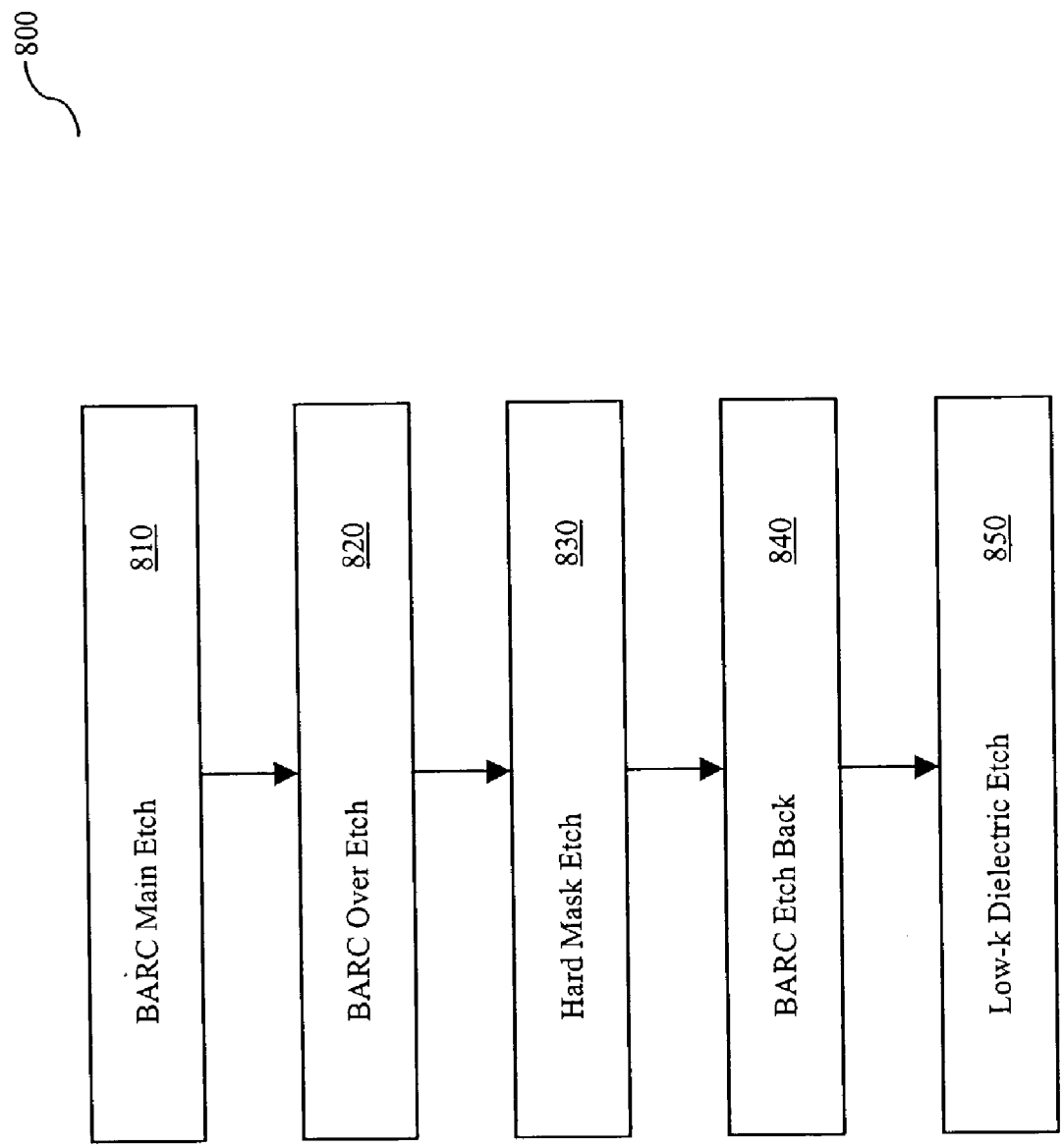
FIG. 8 is a flow chart illustrating a dual damascene trench etching process according to one embodiment of the present invention.

To avoid the problem of fencing, the BARC etch back step 840 is performed after the hard mask etch step 830 to remove a further portion of the BARC 315 so that the top of the BARC 315 is not protruding out of the low-k dielectric layer 330. In one embodiment of the present invention, the BARC etch back step 840 is performed for a sufficient amount of time so that the top of the BARC 315 is below the top of the low-k dielectric layer 330, as shown in FIG. 7A. This way, the low-k dielectric etch step 850 can proceed as shown in FIG. 7B without any portions of the low-k dielectric layer being shadowed from the plasma by the BARC 315. As a result, as shown in FIG. 7C, no fences will appear after the BARC 315 is removed. In one embodiment of the present invention, the process gas used in the BARC etch back step 840 includes a $N_2/O_2$ gas mixture. The plasma of the $N_2/O_2$ gas mixture removes a further portion of the BARC 315 without damaging the hard mask layer 320 exposed to the plasma.

In one embodiment of the present invention, process 800 is performed in reactor 200 and CPU 282 controls the switching between process steps in process 800 according to program instructions stored in memory 284.

EXAMPLES

The following examples illustrate use of the present invention to etch dual damascene trenches after VIAs are formed in the dielectric stack on substrate 360 in FIG. 3. An example of substrate 360 is a silicon wafer of 200 mm (8 inch) or 300 mm (12 inch) diameter. As shown in FIG. 3, the wafer 360 is coated successively with a low-k barrier/liner layer 340 having a thickness of about 500 Å, a low-k dielectric layer 330 having a thickness of about 250-4000 Å, a hard mask layer 320 of about 500-2000 Å. VIAs have been etched through the hard mask layer 320 and the low-k dielectric layer 330. A BARC material 315 fills the VIAs and covers the hard mask layer 320 to a thickness of about 300-1000 Å. A trench mask 310 having a thickness of about 3000-5000 Å is formed on the BARC 315 and is patterned to define trench openings such as opening 305. As will be apparent, the thicknesses of the layers of FIG. 3 are not to scale.

In the following examples, the mask layer 310 is photoresist, such as "RISTON," manufactured by duPont de Nemours Chemical Company. The BARC layer 315 may be any conventional organic BARC that can be spin-applied to a substrate. The hard mask 320 is a conventional tetra-ethyl-ortho-silicate (TEOS) based oxide film or a SiON film. The low-k dielectric layer 320 includes carbon-doped dielectrics such as $CH_3$-doped organo-silicate glass (OSG), organic polymers (e.g. benzocyclobutene, parylene, polytetrafluoroethylene, polyether, polyimide) or the like that are doped with a carbon-based dopant (e.g. $CH_3$). The OSG is sometimes referred to as doped silicon dioxide, examples of which are Black Diamond™ I and Black Diamond™ II, both of which are available from Applied Materials of Santa Clara, Calif. Other examples of the OSG are Coral™ from Novellus of San Jose, Calif., and Sumika Film™ from Sumitomo Chemical America, Inc., Santa Clara, Calif. In the case of Black Diamond™ I, the OSG layer is grown using chemical vapor deposition by oxidizing methyl silane, as disclosed by Yau et al. in U.S. Pat. Nos. 6,054,379 and 6,072,227.

The low-k barrier/liner layer 130 is a BLOk™ (barrier low-k) film, which is a silicon carbide film formed using the chemical vapor deposition (CVD) or plasma enhanced CVD process described in commonly owned U.S. Pat. No. 6,287,990 B1, issued Sep. 11, 2001, and U.S. Pat. No. 6,303,523 B2, issued Oct. 16, 2001, which are incorporated herein by reference. Various layers of the same or other materials, including metal lines 350 also formed on substrate 360, may lie under the BLOk™ layer, which should not affect the practice of the present invention.

During the etching process 800, the substrate 360 is placed on the pedestal 230 of the reactor 200, and the chamber 210 is maintained at a pressure of about 15-300 mTorr (mT). During each step of process 800, a process gas comprising the particular gas compositions described below is introduced into the process chamber 210. The plasma of the process gas is maintained in the process zone 201 by applying a RF power of about 100-2000 W to the pedestal 230. A rotating magnetic field (B-field) of about 0-40 Gauss can also be applied to the process zone 201 to enhance the plasma density.

The wafer 360 is maintained at a temperature of about 15° C. using a flow of helium on the backside of the substrate 360. The pressure of the backside helium is maintained at about 15 Torr. The chamber wall 212 is also kept at a temperature of about 15° C. using a conventional cooling or heating mechanism as necessary for maintaining the chamber wall temperature.

The ranges (minimum and maximum values) of several process parameters used during each process step in process 800 are listed in Table I.

Exemplary values of these process parameters are listed in Table II.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

TABLE I

| Film | Process Gas Flow (sccm) | | | Pressure (mT) | RF Power (W) | B-Field (G) |
|---|---|---|---|---|---|---|
| 810 BARC main etch | $CF_4$ 0-100 | $CHF_3$ 0-50 | Ar 50-200 | 5-100 | 50-500 | 0-30 |
| 820 BARC over etch | $O_2$ 5-50 | $N_2$ 0-100 | | 5-100 | 50-500 | 0-30 |
| 830 Hard Mask | $C_2F_6$ 5-50 | Ar 50-200 | | 50-250 | 300-1000 | 0-30 |
| 840 BARC etch back | $O_2$ 5-50 | $N_2$ 0-100 | | 5-100 | 50-500 | 0-30 |
| 850 Low-k Dielectric | $CF_4$ 20-200 | $O_2$ 0-20 | $N_2$ 50-300 | 50-250 | 200-500 | 0-30 |

TABLE II

| Film | Process Gas Flow (sccm) | | | Pressure (mT) | RF Power (W) | B-Field (G) | Time (sec) |
|---|---|---|---|---|---|---|---|
| BARC main etch 810 | $CF_4$ 40 | $CHF_3$ 10 | Ar 100 | 60 | 300 | 0 | 40 |
| BARC over etch 820 | $O_2$ 15 | $N_2$ 30 | | 25 | 150 | 0 | 11 |
| Hard Mask 830 | $C_2F_6$ 20 | Ar 100 | | 200 | 400 | 0 | 65 |
| BARC etch back 840 | $O_2$ 15 | $N_2$ 30 | | 25 | 150 | 0 | 9 |
| Low-k Dielectric 850 | $CF_4$ 80 | $O_2$ 3 | $N_2$ 200 | 200 | 300 | 0 | 36 |

What is claimed is:

1. A method of forming dual damascene structures in a dielectric stack covered by a BARC material, the method comprising:
    introducing a first process gas into a process zone in which the dielectric stack is located, the first process gas including a fluorocarbon gas, and wherein the dielectric stack does not comprise a middle stop layer;
    maintaining a plasma of the first process gas in the process zone to remove a first portion of the BARC over the dielectric stack thereby exposing a second portion of the BARC;
    introducing a second process gas into the process zone, the second process gas including oxygen and nitrogen;
    continuously maintaining a plasma of the second process gas in the process zone to remove the second portion of the BARC over the dielectric stack;
    introducing a third process gas into the process zone, the third process gas including a fluorocarbon gas;
    maintaining a plasma of the third process gas to etch a hard mask layer disposed in the dielectric stack;
    introducing a fourth process gas into the process zone, the fourth process gas including oxygen and nitrogen; and
    maintaining a plasma of the fourth process gas to etch portions of the BARC material not covering the hard mask layer.

2. The method of claim 1 wherein the dielectric stack includes a low-k dielectric layer, the method further comprising:
    introducing a fifth process gas into the process zone, the fifth process gas including a fluorocarbon gas and nitrogen; and
    maintaining a plasma of the fifth process gas to etch the low-k dielectric layer.

3. The method of claim 2 wherein the fifth process gas does not include an inert gas.

4. The method of claim 1, wherein maintaining the plasma of the first process gas in the process zone to remove the first portion of the BARC further comprises:
    exposing a hardmask layer underlying the BARC to form a trench or via.

5. The method of claim 4, wherein continuously maintaining the plasma of the second process gas in the process zone to remove the second portion of the BARC further comprises:
    clearing the second portion of the BARC layer in the trench or via selectively to the hardmask layer.

6. The method of claim 1, wherein maintaining the plasma of the first process gas in the process zone to remove the first portion of the BARC further comprises:
    etching the BARC to an endpoint prior to introducing the second process gas.

7. A method of forming dual damascene structures in a dielectric stack, the method comprising:
    providing a dielectric stack, wherein the dielectric stack includes a hard mask layer over a low-k dielectric layer and having VIAs formed therein, a BARC material filling the VIAs and covering the dielectric layer and wherein the dielectric stack does not include a middle stop layer;
    removing a first portion of the BARC material covering part of the hard mask layer;
    etching the part of the hard mask layer; and
    removing a second portion of the BARC material not covering the hard mask layer.

8. The method of claim 7 wherein the second portion of the BARC material is removed such that a top of the BARC material is below a top of the low-k dielectric layer.

9. The method of claim 7 wherein removing the first portion of the BARC material comprises:
    introducing a first process gas into a process zone in which the dielectric stack is located, the first process gas including a fluorocarbon gas; and
    maintaining a plasma of the first process gas to remove a first part of the first portion of the BARC material.

10. The method of claim 9 wherein removing the first portion of the BARC material further comprises:
    introducing a second process gas into a process zone in which the dielectric stack is located, the second process gas including oxygen and nitrogen; and
    continuously maintaining a plasma of the second process gas to remove a second part of the first portion of the BARC material.

11. The method of claim 7 wherein etching the hard mask layer comprises:
    introducing a process gas into a process zone in which the dielectric stack is located, the process gas including a fluorocarbon gas; and
    maintaining a plasma of the process gas to etch the hard mask layer.

12. The method of claim 7 wherein removing the second portion of the BARC material further comprises:
introducing a process gas into a process zone in which the dielectric stack is located, the process gas including oxygen and nitrogen; and
maintaining a plasma of the process gas to remove the second portion of the BARC material.

13. The method of claim 7, further comprising etching the low-k dielectric layer.

14. The method of claim 13, wherein etching the low-k dielectric layer comprises:
introducing a process gas into a process zone in which the dielectric stack is located, the process gas including a fluorocarbon gas and nitrogen; and
maintaining a plasma of the process gas to etch the low-k dielectric layer.

15. The method of claim 14 wherein the process gas does not include an inert gas.

16. The method of claim 7, wherein removing the first portion of the BARC material covering part of the hard mask layer further comprises:
etching the BARC to form a feature until an endpoint is reached; and
forming a plasma from a second process gas that is different from the first gas to clear residual BARC from the hard mask layer after the endpoint is reached.

* * * * *

UNITED STATES PATENT AND TRADEMARK OFFICE
CERTIFICATE OF CORRECTION

PATENT NO. : 7,253,115 B2
APPLICATION NO. : 10/360236
DATED : August 7, 2007
INVENTOR(S) : Tanaka et al.

Page 1 of 1

It is certified that error appears in the above-identified patent and that said Letters Patent is hereby corrected as shown below:

In column 4, line 15, after "cross-section" delete "section".

In column 6, line 35, delete "$C_2F_4$" and insert -- $C_2F_6$, $CF_4$ --, therefor.

In column 6, line 60, delete "became" and insert -- become --, therefor.

Signed and Sealed this

Eleventh Day of December, 2007

JON W. DUDAS
*Director of the United States Patent and Trademark Office*